United States Patent
Hiyoshi et al.

(10) Patent No.: US 9,224,877 B2
(45) Date of Patent: Dec. 29, 2015

(54) SILICON CARBIDE SEMICONDUCTOR DEVICE AND METHOD FOR MANUFACTURING SAME

(71) Applicant: Sumitomo Electric Industries, Ltd., Osaka (JP)

(72) Inventors: Toru Hiyoshi, Osaka (JP); Keiji Wada, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/439,610

(22) PCT Filed: Oct. 21, 2013

(86) PCT No.: PCT/JP2013/078481
§ 371 (c)(1),
(2) Date: Apr. 29, 2015

(87) PCT Pub. No.: WO2014/083968
PCT Pub. Date: Jun. 5, 2014

(65) Prior Publication Data
US 2015/0295095 A1    Oct. 15, 2015

(30) Foreign Application Priority Data
Nov. 29, 2012   (JP) .................. 2012-261337

(51) Int. Cl.
*H01L 29/15*   (2006.01)
*H01L 29/872*   (2006.01)
(Continued)

(52) U.S. Cl.
CPC .......... *H01L 29/872* (2013.01); *H01L 21/0485* (2013.01); *H01L 21/0495* (2013.01);
(Continued)

(58) Field of Classification Search
CPC ............ H01L 29/872; H01L 29/66143; H01L 29/6603; H01L 29/6606; H01L 29/0623; H01L 29/66212
USPC ............................................ 257/77; 438/571
See application file for complete search history.

(56) References Cited

U.S. PATENT DOCUMENTS

| | | |
|---|---|---|
| 2006/0214268 A1 | 9/2006 | Maeyama et al. |
| 2007/0228505 A1 | 10/2007 | Mazzola et al. |

(Continued)

FOREIGN PATENT DOCUMENTS

| | | |
|---|---|---|
| JP | 2006-156658 A | 6/2006 |
| JP | 2006-303469 A | 11/2006 |

(Continued)

OTHER PUBLICATIONS

Jochen Hilsenbeck et al., "Avalanche Capability of Unipolar SiC Diodes: a Feature for Ruggedness and Reliability Improvement", Material Science Forum, vols. 615-617 (2009), pp. 659-662.

(Continued)

*Primary Examiner* — Trung Q Dang
(74) *Attorney, Agent, or Firm* — Venable LLP; Michael A. Sartori

(57) ABSTRACT

A first main surface of a silicon carbide substrate has a flat surface located in an element portion and a side wall surface located in a termination portion. The silicon carbide substrate has an impurity layer having a portion located at each of the flat surface of the first main surface and a second main surface. On the flat surface, a Schottky electrode is in contact with the impurity layer. On the second main surface, a counter electrode is in contact with the impurity layer. An insulating film covers the side wall surface. The side wall surface is inclined by not less than 50° and not more than 80° relative to a {000-1}plane. This suppresses the leakage current of a silicon carbide semiconductor device.

13 Claims, 16 Drawing Sheets

(51) Int. Cl.
  *H01L 29/04* (2006.01)
  *H01L 29/06* (2006.01)
  *H01L 29/16* (2006.01)
  *H01L 29/66* (2006.01)
  *H01L 21/04* (2006.01)

(52) U.S. Cl.
  CPC .......... *H01L29/045* (2013.01); *H01L 29/0615* (2013.01); *H01L 29/0619* (2013.01); *H01L 29/1608* (2013.01); *H01L 29/66143* (2013.01)

(56) References Cited

U.S. PATENT DOCUMENTS

| | | | |
|---|---|---|---|
| 2009/0096053 A1 | 4/2009 | Tsuchida et al. | |
| 2012/0256192 A1* | 10/2012 | Zhang | H01L 29/0619 257/77 |
| 2012/0313212 A1* | 12/2012 | Sugawara | H01L 29/0615 257/471 |
| 2013/0062619 A1* | 3/2013 | Henning | H01L 29/8611 257/77 |
| 2014/0061671 A1* | 3/2014 | Wada | H01L 29/872 257/77 |
| 2014/0284615 A1* | 9/2014 | Mauder | H01L 21/3085 257/77 |

FOREIGN PATENT DOCUMENTS

| | | |
|---|---|---|
| JP | 2007-220889 A | 8/2007 |
| JP | 2009-532902 A | 9/2009 |
| JP | 2012-156444 A | 8/2012 |
| JP | 2012-195519 A | 10/2012 |

OTHER PUBLICATIONS

In Ho Kang et al., "Post Annealing Etch Process for Improved Reverse Characteristics of 4H-SiC Diode", Material Science Forum, vols. 615-617 (2009), pp. 663-666.

International Search Report in PCT Application No. PCT/JP2013/078481 dated Nov. 26, 2013.

* cited by examiner

SILICON CARBIDE SEMICONDUCTOR DEVICE AND METHOD FOR MANUFACTURING SAME

TECHNICAL FIELD

The present invention relates to a silicon carbide semiconductor device and a method for manufacturing the silicon carbide semiconductor device.

BACKGROUND ART

In order to increase the breakdown voltage of a Schottky diode, a termination structure can be used to relax an electric field. As such a termination structure, a JTE (Junction Termination Extension), a FLR (Field Limiting Ring) (also referred to as "guard ring"), and the like have been known.

According to Jochen Hilsenbeck et al. "Avalanche Capability of Unipolar SiC Diodes: a Feature for Ruggedness and Reliability Improvement". Material Science Forum. Vols. 615-617 (2009), pp. 659-662 (Non-Patent Document 1), a JTE is provided in a silicon carbide substrate. The JTE is covered with a passivation film (insulating film).

According to in In Ho Kang et al., "Post Annealing Etch Process for Improved Reverse Characteristics of 4H—SiC Diode", Material Science Forum, Vols. 615-617 (2009), pp 663-666 (Non-Patent Document 2), an FLR is provided in a silicon carbide substrate. The FLR is covered with a thermal oxidation film (insulating film).

CITATION LIST

Non Patent Document

NPD 1: Jochen Hilsenbeck et al., "Avalanche Capability of Unipolar SiC Diodes: a Feature for Ruggedness and Reliability Improvement", Material Science Forum, Vols. 615-617 (2009), pp. 659-662

NPD 2: In Ho Kang et al., "Post Annealing Etch Process for Improved Reverse Characteristics of 4H—SiC Diode". Material Science Forum. Vols. 615-617 (2009), pp. 663-666

SUMMARY OF INVENTION

Technical Problem

As described above, in the termination structure, an interface is formed between the silicon carbide substrate and the insulating film. As a current is more likely to flow along this interface, a leakage current of the silicon carbide semiconductor device becomes larger. Hence, a demand arises in a termination structure capable of reducing such a leakage current.

The present invention has been made to solve the problem described above, and has an object to provide a silicon carbide semiconductor device capable of suppressing a leakage current as well as a method for manufacturing such a silicon carbide semiconductor device.

Solution to Problem

A silicon carbide semiconductor device according to one aspect of the present invention has an element portion provided with a semiconductor element, and a termination portion surrounding the element portion. The silicon carbide semiconductor device includes a silicon carbide substrate, a Schottky electrode, a counter electrode, and an insulating film. The silicon carbide substrate is made of silicon carbide having a hexagonal single-crystal structure. The silicon carbide substrate has a first main surface and a second main surface opposite to the first main surface. The first main surface has a flat surface that is located in the element portion and a side wall surface that is located in the termination portion, that surrounds the flat surface, and that is inclined relative to the flat surface so as to come close to the second main surface. The silicon carbide substrate includes an impurity layer having a first conductivity type. The impurity layer has a portion located at the flat surface of the first main surface. The Schottky electrode is in contact with the impurity layer on the flat surface of the first main surface. The counter electrode is provided on the second main surface. The insulating film covers the side wall surface of the first main surface. The side wall surface is inclined by not less than 50° and not more than 80° relative to a {000-1}plane.

In accordance with the silicon carbide semiconductor device according to the above-described one aspect, the side wall surface disposed in the termination portion is inclined by not less than 50° and not more than 80° relative to the {000-1} plane. Accordingly, in the termination portion, an interface state density in the interface between the side wall surface of the silicon carbide substrate and the insulating film can be made low. This suppresses generation of electric current resulting from existence of the interface state. Therefore, the leakage current of the silicon carbide semiconductor device can be suppressed.

Preferably, the side wall surface of the first main surface of the silicon carbide substrate includes a first plane having a plane orientation of {0-33-8}. More preferably, the side wall surface of the first main surface of the silicon carbide substrate microscopically includes the first plane, and the side wall surface microscopically further includes a second plane having a plane orientation of {0-11-1}. More preferably, the first and second planes of the side wall surface of the first main surface of the silicon carbide substrate form a combined plane having a plane orientation of {0-11-2}. Accordingly, the leakage current of the silicon carbide semiconductor device can be suppressed more securely.

A silicon carbide semiconductor device according to another aspect of the present invention has an element portion provided with a semiconductor element, and a termination portion surrounding the element portion. The silicon carbide semiconductor device includes a silicon carbide substrate, a Schottky electrode, a counter electrode, and an insulating film. The silicon carbide substrate is made of silicon carbide having a hexagonal single-crystal structure. The silicon carbide substrate has a first main surface and a second main surface opposite to the first main surface. The first main surface has a flat surface that is located in the element portion and a side wall surface that is located in the termination portion, that surrounds the flat surface, and that is inclined relative to the flat surface so as to come close to the second main surface. The silicon carbide substrate includes an impurity layer having a first conductivity type. The impurity layer has a portion located in the flat surface of the first main surface. The Schottky electrode is in contact with the impurity layer on the flat surface of the first main surface. The counter electrode is provided on the second main surface. The insulating film covers the side wall surface of the first main surface. The side wall surface has one of plane orientations of {0-33-8}, {0-11-2}, {0-11-4} and {0-11-1} when viewed macroscopically.

In accordance with the silicon carbide semiconductor device according to the above-described another aspect, the side wall surface disposed in the termination portion has one of plane orientations of {0-33-8}, {0-11-2}, {0-11-4} and {0-11-1} when viewed macroscopically. Accordingly, in the termination portion, an interface state density in the interface between the side wall surface of the silicon carbide substrate and the insulating film can be made low. This suppresses generation of electric current resulting from existence of the interface state. Therefore, the leakage current of the silicon carbide semiconductor device can be suppressed.

Preferably, an embedded region is embedded at the flat surface of the first main surface of the silicon carbide substrate, the embedded region being in contact with the Schottky electrode and having a second conductivity type different from the first conductivity type. Accordingly, a so-called JBS (Junction Barrier Schottky) structure is provided, thereby increasing the breakdown voltage of the silicon carbide semiconductor device.

Preferably, a side wall impurity region is provided at the side wall surface of the first main surface of the silicon carbide substrate, the side wall impurity region having a second conductivity type different from the first conductivity type. More preferably, the side wall impurity region includes a boundary between the side wall surface and the flat surface on the first main surface of the silicon carbide substrate. Accordingly, electric field concentration is relaxed, thereby increasing the breakdown voltage of the silicon carbide semiconductor device.

Preferably, the side wall impurity region is in contact with the Schottky electrode. Accordingly, the potential of the side wall impurity region is stabilized.

In the silicon carbide semiconductor device described above, an embedded region may be embedded at the flat surface of the first main surface of the silicon carbide substrate, the embedded region being in contact with the Schottky electrode and having a second conductivity type different from the first conductivity type. A side wall impurity region may be provided at the side wall surface of the first main surface of the silicon carbide substrate, the side wall impurity region having the second conductivity type, the side wall impurity region having an impurity concentration lower than an impurity concentration of the embedded region, the side wall impurity region being connected to the embedded region. Accordingly, the side wall impurity is electrically connected to the first main electrode via the embedded region. Therefore, the potential of the side wall impurity region is stabilized.

Preferably, the first main surface of the silicon carbide substrate has a bottom surface surrounding the side wall surface in the termination portion, and the bottom surface has a smaller inclination relative to the flat surface than an inclination of the side wall surface relative to the flat surface. Hence, the bottom surface of the termination portion can be readily provided with the structure for relaxing the electric field concentration.

Preferably, a guard ring region is provided at the bottom surface of the first main surface of the silicon carbide substrate, the guard ring region having a second conductivity type different from the first conductivity type, the guard ring region being separated from the side wall surface, the guard ring region surrounding the side wall surface. Accordingly, electric field concentration is relaxed, thereby increasing the breakdown voltage of the silicon carbide semiconductor device.

A method for manufacturing a silicon carbide semiconductor device in the present invention is a method for manufacturing a silicon carbide semiconductor device having an element portion provided with a semiconductor element, and a termination portion surrounding the element portion, and includes the following steps. A silicon carbide substrate is prepared which is made of silicon carbide having a hexagonal single-crystal structure. The silicon carbide substrate has a first main surface and a second main surface opposite to the first main surface. The first main surface has a flat surface that is located in the element portion and a side wall surface that is located in the termination portion, that surrounds the flat surface, and that is inclined relative to the flat surface so as to come close to the second main surface. The silicon carbide substrate includes an impurity layer having a first conductivity type. The impurity layer has a portion located in the flat surface of the first main surface. The step of preparing the silicon carbide substrate includes the step of forming the side wall surface by thermal etching on the first main surface. An insulating film is formed which covers the side wall surface of the first main surface. A Schottky electrode is formed in contact with the impurity layer on the flat surface of the first main surface. A counter electrode is formed on the second main surface.

According to the manufacturing method described above, the side wall surface is formed by the thermal etching. By using the thermal etching, the plane orientation of the side wall surface can become suitable for suppression of interface state between the side wall surface and the insulating film. This suppresses generation of electric current resulting from existence of the interface state. Therefore, the leakage current of the silicon carbide semiconductor device can be suppressed.

Advantageous Effects of Invention

According to the present invention, the leakage current of the silicon carbide semiconductor device can be suppressed as described above.

DESCRIPTION OF EMBODIMENTS

Figure 1:
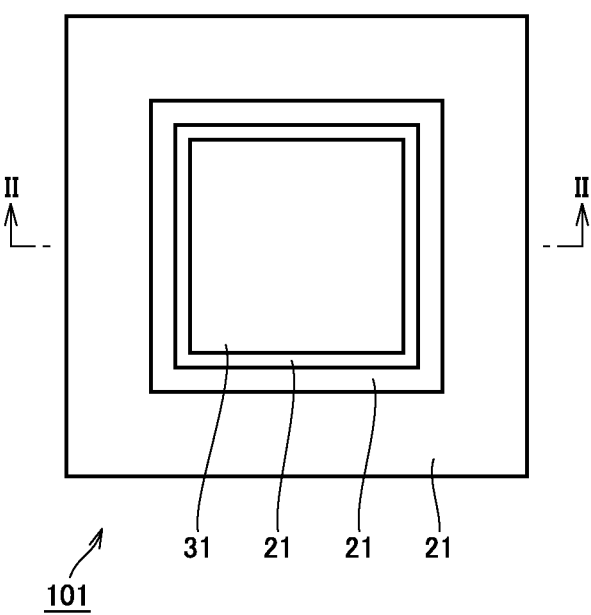
FIG. 1 is a plan view schematically showing a configuration of a silicon carbide semiconductor device in one embodiment of the present invention.

The following describes an embodiment of the present invention with reference to figures. It should be noted that in the below-mentioned figures, the same or corresponding portions are given the same reference characters and are not described repeatedly. Regarding crystallographic indications of the present specification, an individual plane is represented by ( ), and a group plane is represented by { }. Further, in order to indicate that a plane has a negative index, instead of putting "-" (bar) above a numeral, a negative sign is put before the numeral.

(Configuration of Silicon Carbide Semiconductor Device)

Figure 2:
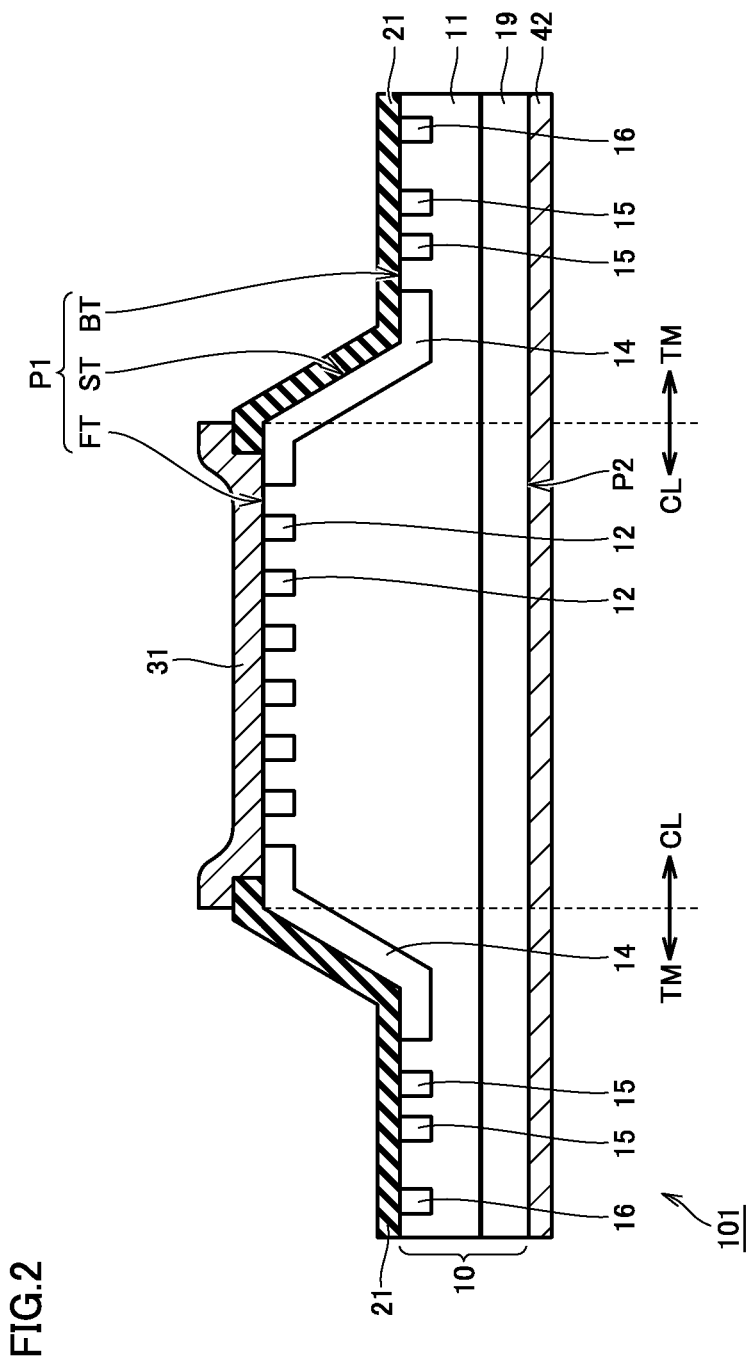
FIG. 2 is a partial schematic cross sectional view taken along a line II-II in FIG. 1.

As shown in FIG. 1 and FIG. 2, a diode 101 (silicon carbide semiconductor device) includes: an element portion CL provided with a Schottky junction element (semiconductor element), and a termination portion TM surrounding element portion CL. Diode 101 has an epitaxial substrate 10 (silicon carbide substrate), a Schottky electrode 31, a counter electrode 42, and an insulating film 21.

Epitaxial substrate 10 is made of silicon carbide having a hexagonal single-crystal structure. The single-crystal structure preferably has polytype 4H. Epitaxial substrate 10 has an upper surface P1 (first main surface) and a backside surface P2 (second main surface opposite to the first main surface).

Upper surface P1 has a flat surface FT, a side wall surface ST, and a bottom surface BT. Flat surface FT is located in element portion CL. Side wall surface ST and bottom surface BT are located in termination portion TM. Side wall surface ST surrounds flat surface FT and is inclined relative to flat surface FT so as to come close to backside surface P2. Bottom surface BT surrounds side wall surface ST in termination portion TM. Bottom surface BT has a smaller inclination relative to flat surface FT than the inclination of side wall surface ST relative to flat surface FT. Here, the "smaller inclination" represents a concept including a case where there is no inclination, i.e., a concept including parallelism. Therefore, bottom surface BT may be substantially in parallel with flat surface FT as shown in FIG. 2.

Flat surface FT of upper surface P1 is preferably substantially in parallel with a {000-1} plane. Specifically, the inclination of flat surface FT relative to the {000-1} plane is preferably not more than 10°, more preferably, not more than 5°.

Side wall surface ST of upper surface P1 is inclined by not less than 50° and not more than 80° relative to the {000-1} plane.

Side wall surface ST of upper surface P1 may have one of plane orientations of {0-33-8}, {0-11-2}, {0-11-4} and {0-11-1} when viewed macroscopically. It should be noted that the plane orientation of {0-33-8} has an off angle of 54.7° relative to the {000-1} plane. The plane orientation of {0-11-1} has an off angle of 75.1° relative to the {000-1} plane. Therefore, the plane orientations of {0-33-8}, {0-11-2}, {0-11-4}, and {0-11-1} correspond to off angles of 54.7° to 75.1°. In view of such a fact that there is considered a production error of about 5° with regard to the off angle, a process is performed to incline side wall surface ST of upper surface P1 by about not less than 50° and not more than 80° relative to the {000-1} plane, whereby the macroscopic plane orientation of side wall surface ST is likely to correspond to one of {0-33-8}, {0-11-2}, {0-11-4} and {0-11-1}.

Side wall surface ST as described above is readily provided with a "special plane". Details of the special plane will be described later.

Epitaxial substrate 10 has a single-crystal substrate 19, an n layer 11 (impurity layer), a JBS region 12 (embedded region), a JTE region 14 (side wall impurity region), a guard ring region 15, and a field stop region 16. Single-crystal substrate 19 has n type conductivity (first conductivity type). N layer 11 has n type conductivity and has an impurity concentration lower than the impurity concentration of single-crystal substrate 19. N layer 11 has a portion located at flat surface FT of upper surface P1.

JBS region 12 has p type conductivity (second conductivity type different from the first conductivity type) JBS region 12 is embedded at flat surface FT of upper surface P1 of epitaxial substrate 10. JBS region 12 is in contact with Schottky electrode 31.

JTE region 14 has p type conductivity. JTE region 14 is provided at side wall surface ST of upper surface P1. On upper surface P1 of epitaxial substrate 10, JTE region 14 includes a boundary between side wall surface ST and flat surface FT. JTE region 14 has an impurity concentration lower than the impurity concentration of JBS region 12. In diode 101, JTE region 14 is in contact with Schottky electrode 31.

Guard ring region 15 has p type conductivity. Guard ring region 15 is provided at bottom surface BT of upper surface P1 of epitaxial substrate 10, is separated from side wall surface ST, and surrounds side wall surface ST.

Field stop region 16 has n type conductivity and has an impurity concentration higher than the impurity concentration of n layer 11. Field stop region 16 surrounds side wall surface ST.

Insulating film 21 covers side wall surface ST and bottom surface BT of upper surface P1. Insulating film 21 has an opening through which a portion of flat surface FT of upper surface P1 is exposed. On flat surface FT of upper surface P1, Schottky electrode 31 in contact with n layer 11 and JBS region 12. Counter electrode 42 is an ohmic electrode provided on backside surface P2 and in contact with single-crystal substrate 19.

Figure 3:
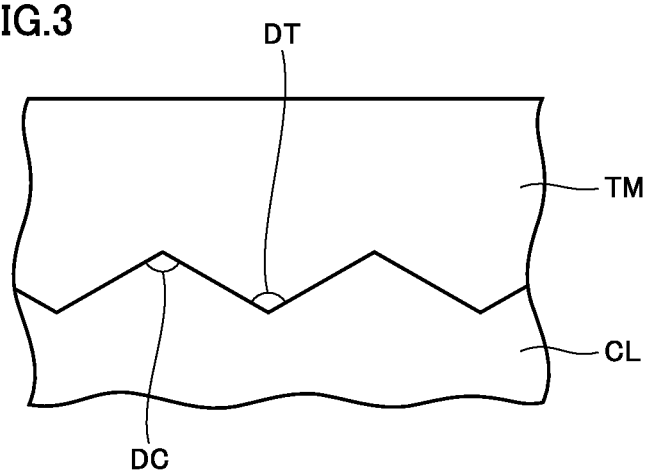
FIG. 3 is a partial enlarged view of FIG. 1.
Figure 4:
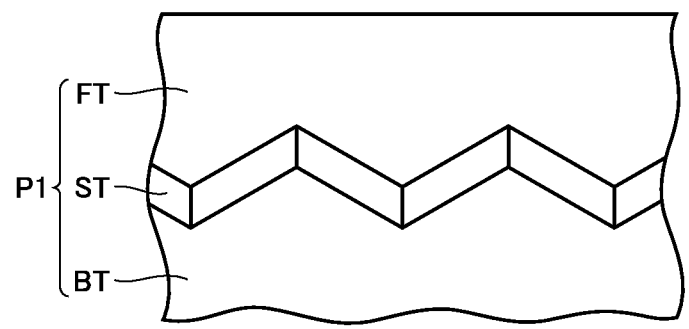
FIG. 4 is a plan view of a silicon carbide substrate corresponding to a field of view of FIG. 3.

As shown in FIG. 3, when viewed in a plan view, the boundary between element portion CL and termination portion TM may include a zigzag configuration. In this zigzag configuration, an angle DC of a portion projecting from element portion CL to termination portion TM is preferably 60°. Moreover, in this zigzag configuration, an angle DT of a portion projecting from termination portion TM to element portion CL is preferably 60°. 60° is preferable because epitaxial substrate 10 has a hexagonal crystal structure, which has six-fold symmetry. As shown in FIG. 4, side wall surface ST is preferably disposed along the zigzag configuration, and bottom surface BT is provided adjacent to side wall surface ST in this zigzag configuration.

(Method for Manufacturing Silicon Carbide Semiconductor Device)

The following describes a method for manufacturing diode 101 (FIG. 2).

Figure 5:
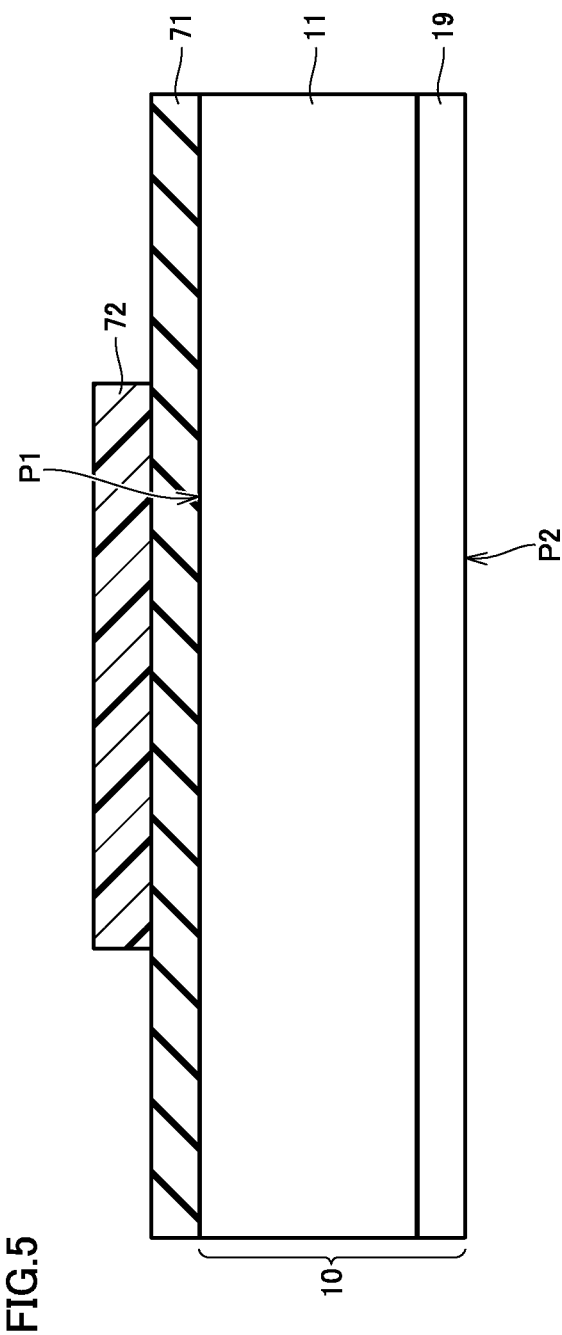
FIG. 5 is a partial cross sectional view schematically showing a first step of a method for manufacturing the silicon carbide semiconductor device of FIG. 2.

With reference to FIG. 5, n layer 11 to constitute upper surface P1 is formed through epitaxial growth of silicon carbide on single-crystal substrate 19. Accordingly, epitaxial substrate 10 having single-crystal substrate 19 and n layer 11 is formed. The epitaxial growth can be performed by means of the CVD (Chemical Vapor Deposition) method. On this occasion, hydrogen gas can be used as a carrier gas. As a source material gas, a mixed gas of silane ($SiH_4$) and propane ($C_3H_8$) can be used, for example. In doing so, it is preferable to introduce nitrogen (N) or phosphorus (P) as an impurity for providing silicon carbide with n type conductivity, for example.

Figure 6:
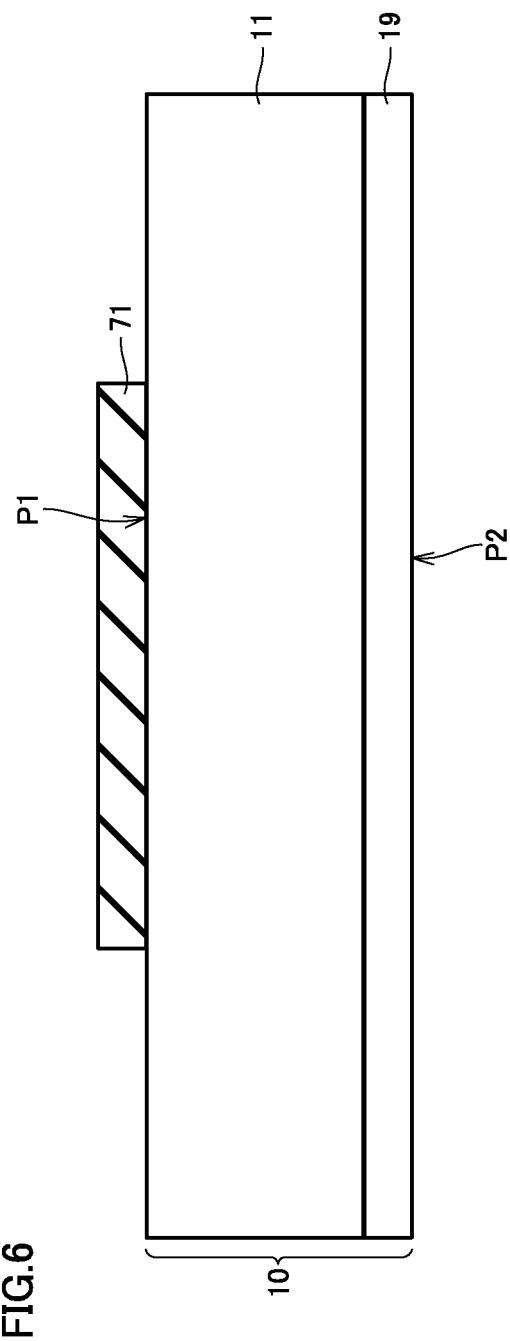
FIG. 6 is a partial cross sectional view schematically showing a second step of the method for manufacturing the silicon carbide semiconductor device of FIG. 2.

Next, a mask layer 71 is formed on upper surface P1. Preferably, mask layer 71 is a thermal oxidation film formed on upper surface P1 of epitaxial substrate 10. Next, a photoresist layer 72 having a pattern is formed on mask layer 71. With etching using photoresist layer 72, this pattern is transferred to mask layer 71 (FIG. 6).

Figure 7:
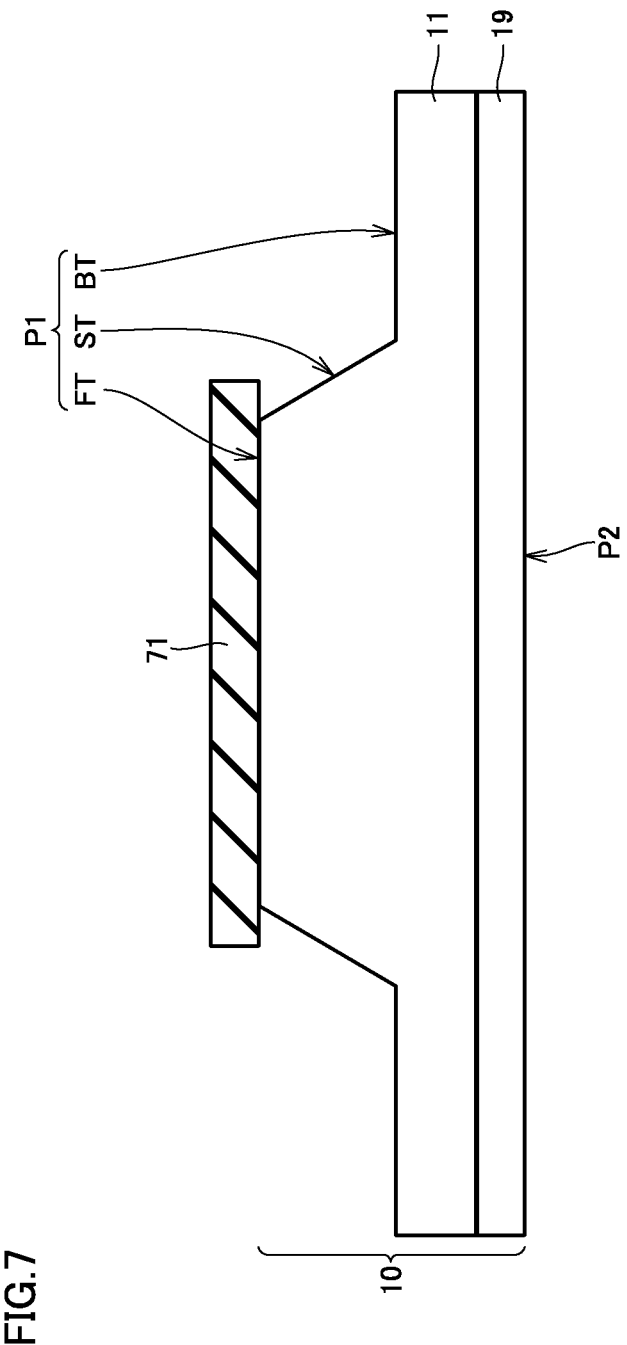
FIG. 7 is a partial cross sectional view schematically showing a third step of the method for manufacturing the silicon carbide semiconductor device of FIG. 2.
Figure 8:
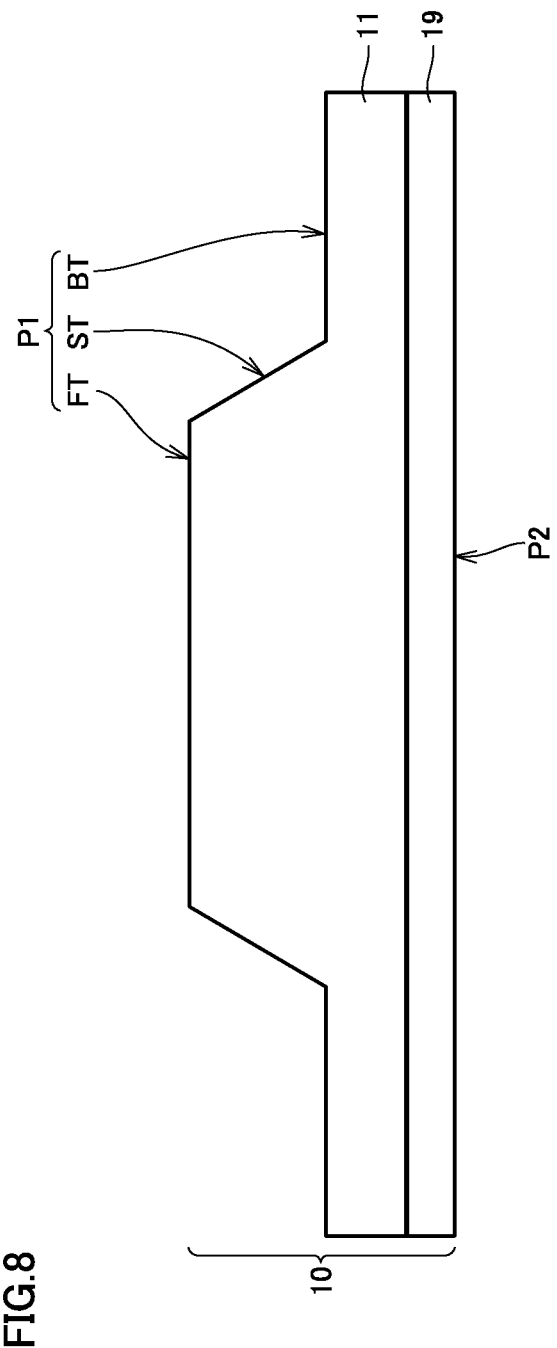
FIG. 8 is a partial cross sectional view schematically showing a fourth step of the method for manufacturing the silicon carbide semiconductor device of FIG. 2.

As shown in FIG. 7, on upper surface P1, thermal etching is performed using mask layer 71. Accordingly, side wall surface ST and bottom surface BT are formed at upper surface P1 of epitaxial substrate 10. By using the thermal etching, the special plane is spontaneously formed in side wall surface ST. Details of the thermal etching will be described later. Next, mask layer 71 is removed (FIG. 8).

Figure 9:
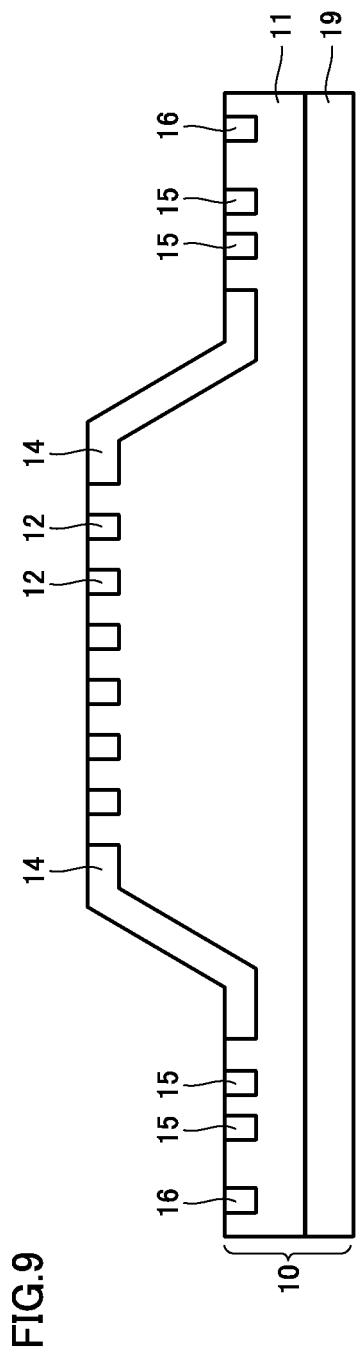
FIG. 9 is a partial cross sectional view schematically showing a fifth step of the method for manufacturing the silicon carbide semiconductor device of FIG. 2.

As shown in FIG. 9. JBS region 12, JTE region 14, guard ring region 15, and field stop region 16 are formed by ion implantations of conductive impurities. Next, an activation heat treatment is performed to activate the impurities. For example, heating is performed for 30 minutes at a temperature of approximately 1700° C. in an argon (Ar) atmosphere.

Figure 10:
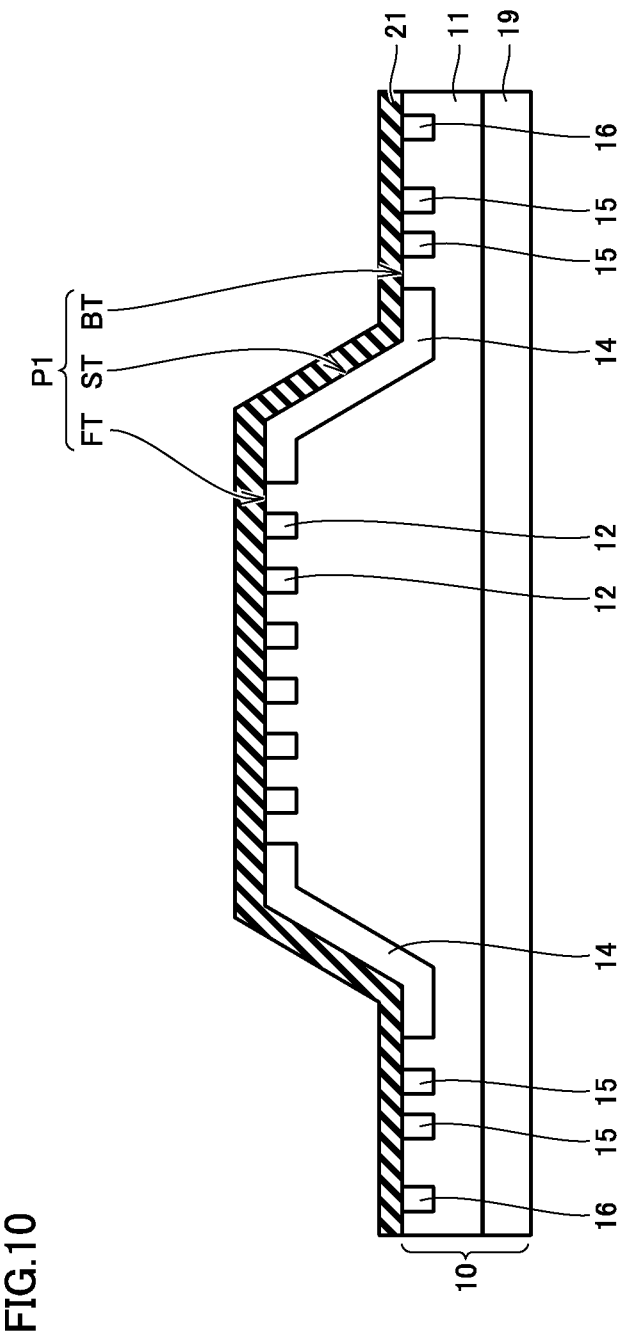
FIG. 10 is a partial cross sectional view schematically showing a sixth step of the method for manufacturing the silicon carbide semiconductor device of FIG. 2.

As shown in FIG. 10, through the thermal oxidation of upper surface P1 of epitaxial substrate 10, insulating film 21 is formed to cover upper surface P1. The thermal oxidation is performed by heating epitaxial substrate 10 for approximately 30 minutes at a temperature of approximately 1200° C. in air or oxygen, for example.

Next, nitrogen annealing is performed. Accordingly, the nitrogen concentration is adjusted to have a maximum value of about $1 \times 10^{21}/cm^3$ or greater in a region within 10 nm from an interface between epitaxial substrate 10 and insulating film 21. For example, in an atmosphere of gas containing nitrogen, such as nitrogen monoxide gas, heating is performed at a temperature of approximately 1100° C. for approximately 120 minutes. After this nitrogen annealing treatment, an annealing treatment may be performed additionally in an inert gas atmosphere. For example, in an argon atmosphere, heating is performed at a temperature of approximately 1100° C. for approximately 60 minutes.

Figure 11:
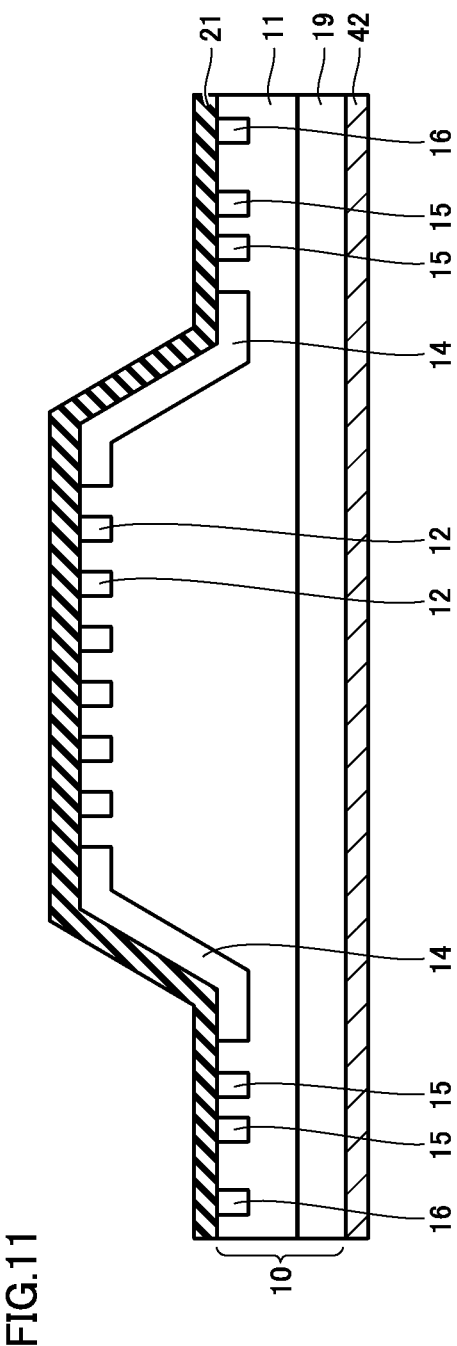
FIG. 11 is a partial cross sectional view schematically showing a seventh step of the method for manufacturing the silicon carbide semiconductor device of FIG. 2.

As shown in FIG. 11, counter electrode 42 is formed on backside surface P2 of epitaxial substrate 10. Counter electrode 42 is configured as an ohmic electrode resulting from silicidation through a heat treatment.

Figure 12:
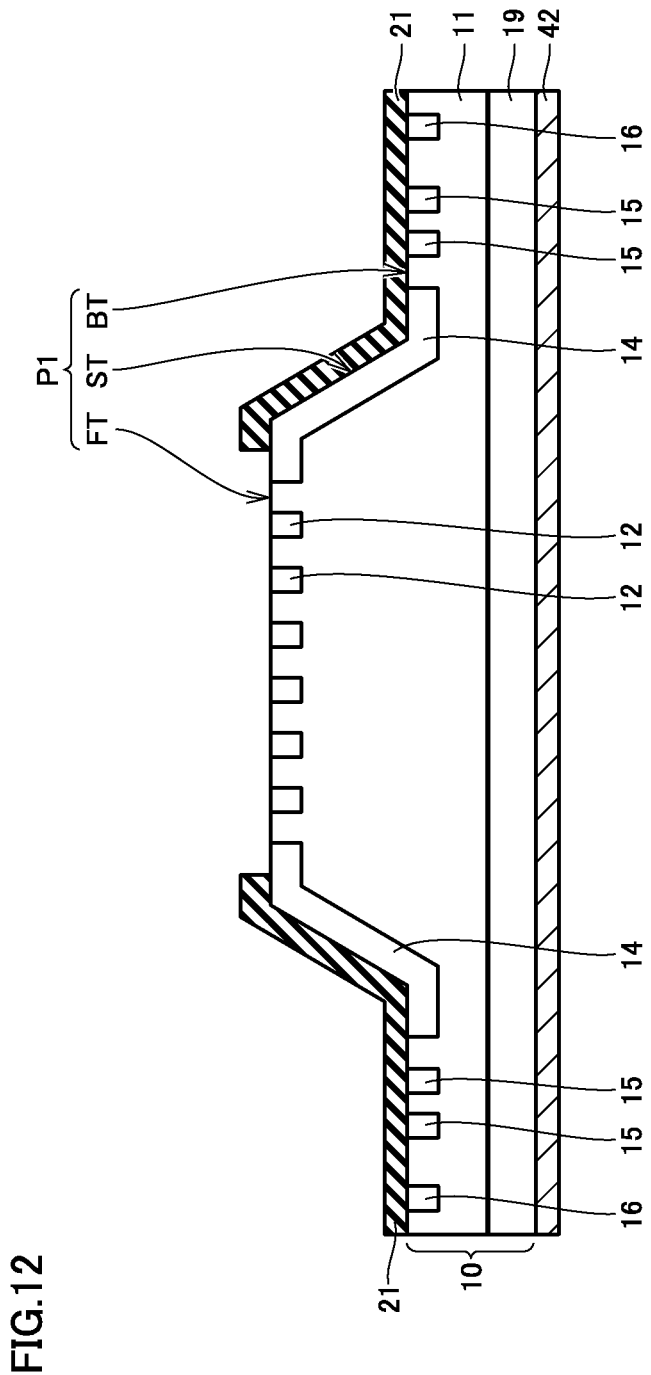
FIG. 12 is a partial cross sectional view schematically showing an eighth step of the method for manufacturing the silicon carbide semiconductor device of FIG. 2.

As shown in FIG. 12, an opening is formed in insulating film 21 to expose a portion of flat surface FT of upper surface P1.

Next, with reference to FIG. 2 again, on flat surface FT of upper surface P1, Schottky electrode 31 is formed in contact with n layer 11 and JBS region 12. Accordingly, diode 101 is obtained.

(Thermal Etching)

The thermal etching is performed by subjecting an object, to be etched, to an etching gas under a high temperature, and has substantially no physical etching function. A process gas for the thermal etching contains a halogen element. More preferably, the halogen element is chlorine or fluorine. Specifically, an exemplary, usable process gas is a process gas containing at least one of $Cl_2$, $BCl_3$, $CF_4$, and $SF_6$, and $Cl_2$ can be used particularly suitably.

Moreover, the process gas preferably further contains oxygen gas. Further, the process gas may contain a carrier gas. Examples of the carrier gas include nitrogen gas, argon gas, or helium gas.

Preferably, the heat treatment temperature of the thermal etching is not less than 700° C. and not more than 1200° C. The lower limit of this temperature is more preferably 800° C., further preferably 900° C. Accordingly, the etching rate can attain a sufficiently practical value. Further, the upper limit of this temperature is more preferably 1100° C., further preferably 1000° C. When the heat treatment temperature is set at not less than 700° C. and not more than 1000° C., a rate of etching SiC is approximately, for example, 70 μm/hr.

(Function and Effect)

According to diode 101 of the present embodiment, side wall surface ST disposed in termination portion TM is inclined by not less than 50° and not more than 80° relative to the {000-1} plane. In this way, the plane orientation of side wall surface ST can become suitable for suppression of interface state between side wall surface ST and insulating film 21. Accordingly, in termination portion TM, an interface state density in the interface between side wall surface ST of epitaxial substrate 10 and insulating film 21 can be made low. This suppresses generation of electric current resulting from existence of the interface state. Therefore, the leakage current of diode 101 can be suppressed. Moreover, side wall surface S1 can be readily provided with the "special plane", and the leakage current is suppressed more in this case. Substantially the same applies to side wall surface ST having one of plane orientations of {0-33-8}, {0-11-2}, {0-11-4} and {0-11-1} when viewed macroscopically.

JBS region 12 is embedded at flat surface FT of upper surface P1 of epitaxial substrate 10. Accordingly, the breakdown voltage of diode 101 can be increased.

JTE region 14 is provided at side wall surface ST of upper surface P of epitaxial substrate 10. On upper surface P1. JTE region 14 includes the boundary between side wall surface ST and flat surface FT. Accordingly, electric field concentration is relaxed, thereby increasing the breakdown voltage of diode 101. In the present embodiment, JTE region 14 is in contact with Schottky electrode 31. Accordingly, the potential of JTE region 14 is stabilized.

Moreover, upper surface P1 is provided with bottom surface BT having a smaller inclination relative to flat surface FT than the inclination of the side wall surface relative to flat surface FT. Hence, bottom surface BT can be readily provided with the structure for relaxing the electric field concentration. Specifically, guard ring region 15 is provided at bottom surface BT. Accordingly, the electric field concentration is relaxed, thereby increasing the breakdown voltage of diode 101.

Moreover, side wall surface ST is formed by thermal etching. By using the thermal etching, the plane orientation of side wall surface ST can become suitable for suppression of interface state between side wall surface ST and insulating film 21. Specifically, a special plane can be formed in side wall surface ST. This suppresses generation of electric current resulting from existence of the interface state. Therefore, a leakage current of diode 101 can be suppressed.

(Modification)

Figure 13:
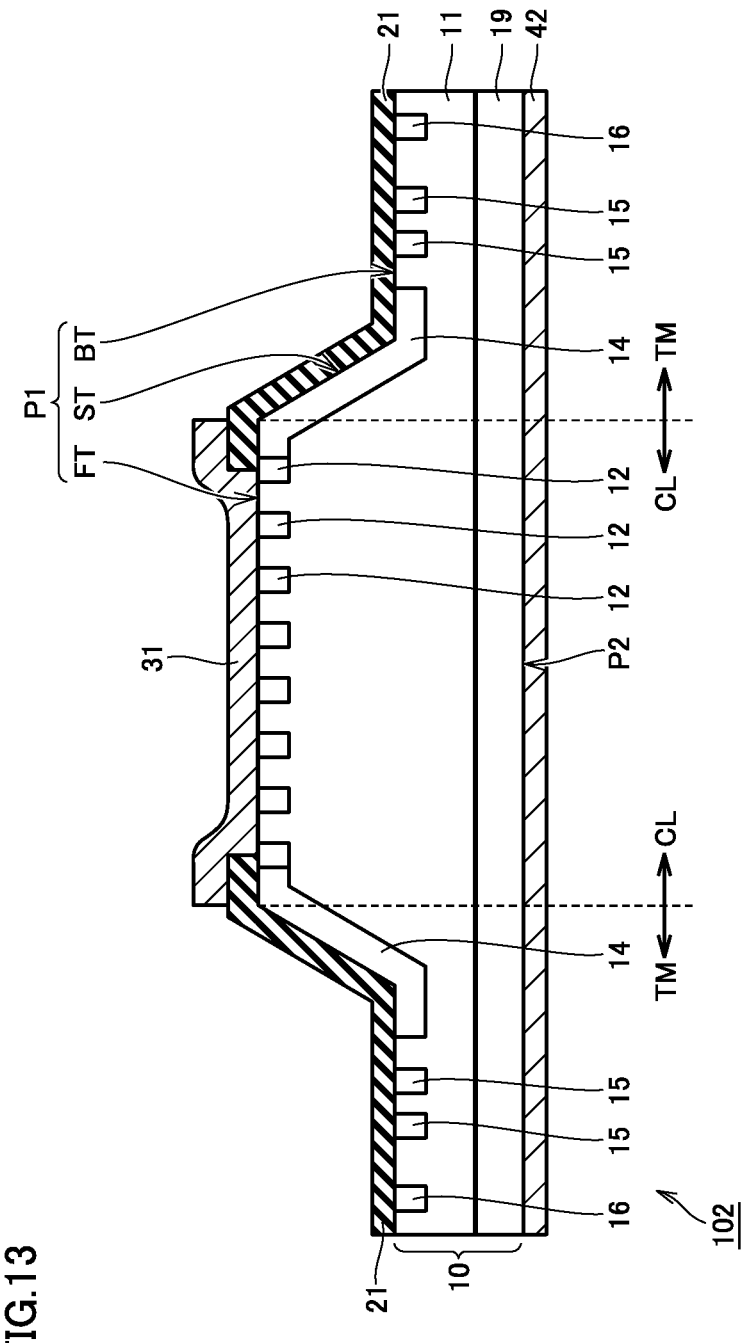
FIG. 13 is a partial cross sectional view schematically showing a configuration of a modification of the silicon carbide semiconductor device of FIG. 2.

As shown in FIG. 13, in a diode 102 of the present modification, JTE region 14 is connected to JBS region 12. In this way, even when JTE region 14 is not in contact with Schottky electrode 31. JTE region 14 is electrically connected to Schottky electrode 31 via JBS region 12. Accordingly, the potential of JTE region 14 is stabilized.

(Special Plane)

Figure 14:
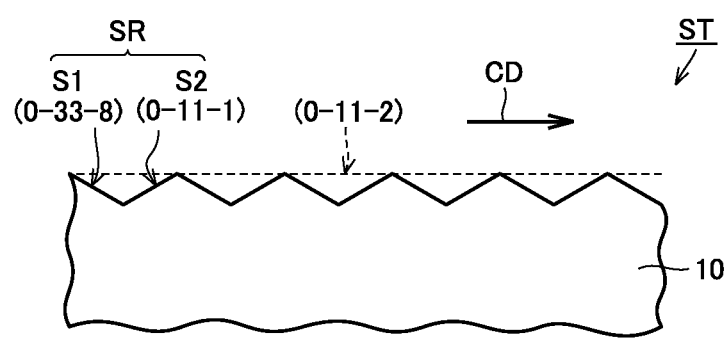
FIG. 14 is a partial cross sectional view schematically showing an example of a fine structure in a side wall surface of the silicon carbide substrate included in the silicon carbide semiconductor device.

Side wall surface ST of upper surface P1 preferably has a special plane. Such a side wall surface ST includes a plane S1 (first plane) having a plane orientation of {0-33-8} as shown in FIG. 14. Plane S1 preferably has a plane orientation of (0-33-8). More preferably, side wall surface ST microscopically includes plane S1, and side wall surface ST microscopically further includes a plane S2 (second plane) having a plane orientation of {0-11-1}. Here, the term "microscopically" refers to "minutely to such an extent that at least the size about twice as large as an interatomic spacing is considered". As a method for observing such a microscopic structure, for example, a TEM (Transmission Electron Microscope) can be used. Plane S2 preferably has a plane orientation of (0-11-1).

Preferably, plane S1 and plane S2 of side wall surface ST form a combined plane SR having a plane orientation of {0-11-2}. In other words, combined plane SR is formed of periodically repeated planes S1 and S2. Such a periodic structure can be observed by, for example, TEM or AFM (Atomic Force Microscopy). In this case, combined plane SR has an off angle of 62° relative to the {000-1} plane, macroscopically. Here, the term "macroscopically" refers to "disregarding a fine structure having a size of approximately interatomic spacing". For the measurement of such a macroscopic off angle, a method employing general X-ray diffraction can be used, for example.

Preferably, combined plane SR has a plane orientation of (0-11-2). In this case, combined plane SR has an off angle of 62° relative to the (000-1) plane, macroscopically. Preferably, a direction CD in which leakage current flows is along a direction in which the above-described periodic repetition is made. Direction CD corresponds to a direction in which the thickness direction (longitudinal direction in FIG. 2) of epitaxial substrate 10 is projected to side wall surface ST.

Next, a detailed structure of combined plane SR will be described.

Figure 15:
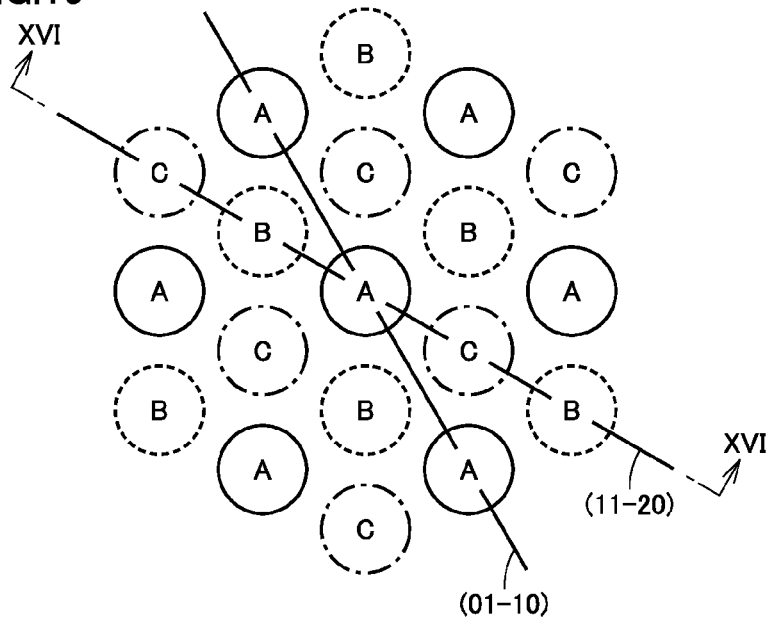
FIG. 15 shows a crystal structure of a (000-1) plane in a hexagonal crystal of polytype 4H.

Generally, regarding Si atoms (or C atoms), when viewing a silicon carbide single crystal of polytype 4H from the (000-1) plane, atoms in a layer A (solid line in the figure), atoms in a layer B (broken line in the figure) disposed therebelow, and atoms in a layer C (chain line in the figure) disposed therebelow, and atoms in a layer B (not shown in the figure) disposed therebelow are repeatedly provided as shown in FIG. 15. In other words, with four layers ABCB being regarded as one period, a periodic stacking structure such as ABCBAB-CBABCB . . . is provided.

Figure 16:
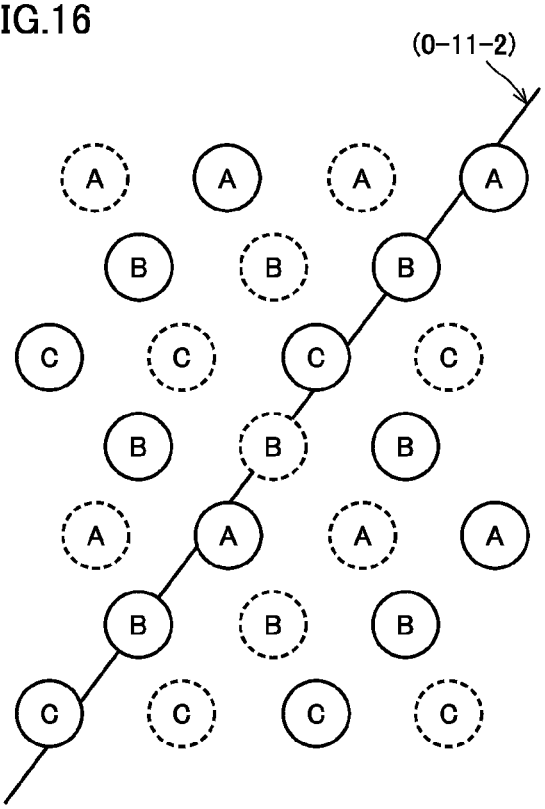
FIG. 16 shows a crystal structure of a (11-20) plane along a line XVI-XVI of FIG. 15.

As shown in FIG. 16, in the (11-20) plane (cross section taken along a line XVI-XVI of FIG. 15), atoms in each of four layers ABCB constituting the above-described one period are not aligned completely along the (0-11-2) plane. In FIG. 16, the (0-11-2) plane is illustrated to pass through the locations of the atoms in layers B. In this case, it is understood that each of atoms in layers A and C is deviated from the (0-11-2) plane. Hence, even when the macroscopic plane orientation of the surface of the silicon carbide single crystal, i.e., the plane orientation thereof with its atomic level structure being ignored is limited to (0-11-2), this surface can have various structures microscopically.

Figure 17:
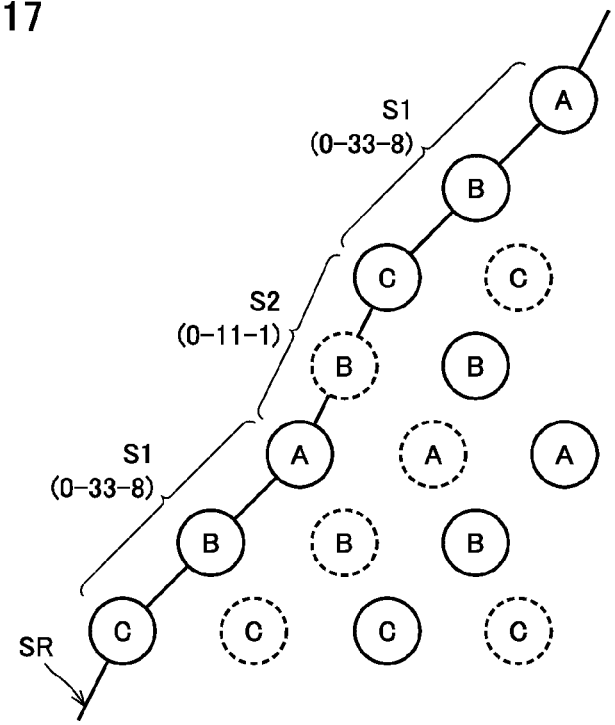
FIG. 17 shows a crystal structure in the vicinity of a surface with a combined plane of FIG. 14 within a (11-20) plane.

As shown in FIG. 17, combined plane SR is constructed by alternately providing planes S1 having a plane orientation of (0-33-8) and planes S2 connected to planes S1 and having a plane orientation different from that of each of planes S1. Each of planes S1 and S2 has a length twice as large as the interatomic spacing of the Si atoms (or C atoms). It should be noted that a plane with plane S1 and plane S2 being averaged corresponds to the (0-11-2) plane (FIG. 16).

Figure 18:
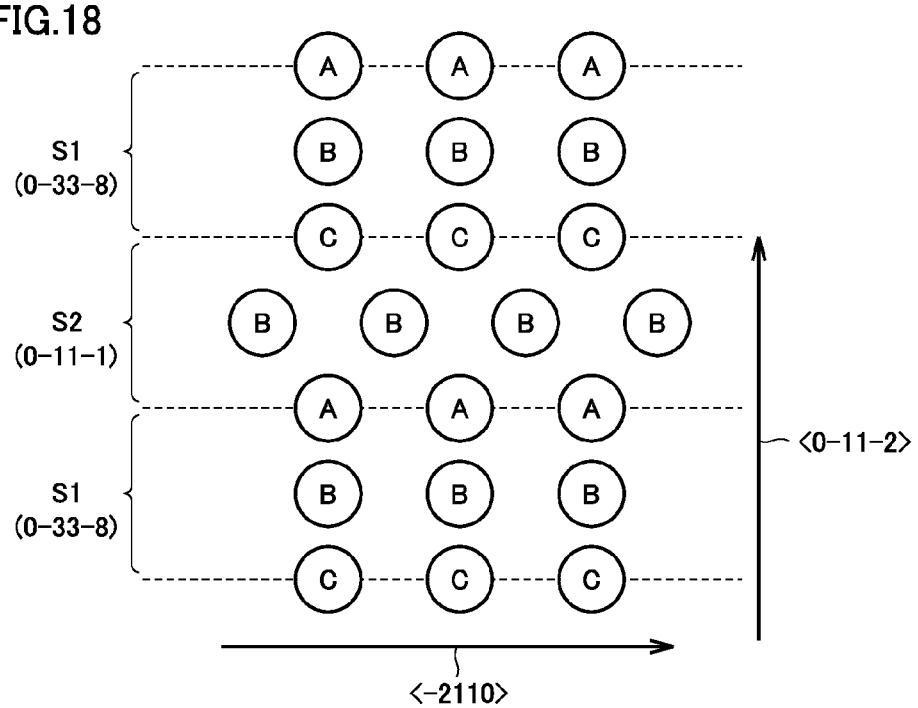
FIG. 18 shows the combined plane of FIG. 14 when viewed from a (01-10) plane.

As shown in FIG. 18, when viewing combined plane SR from the (01-10) plane, the single-crystal structure has a portion periodically including a structure (plane S1 portion) equivalent to a cubic structure. Specifically, combined plane SR is constructed by alternately providing planes S1 having a plane orientation of (001) in the above-described structure equivalent to the cubic structure and planes S2 connected to planes S1 and having a plane orientation different from that of each of planes S1. Also in a polytype other than polytype 4H, the surface can be thus constituted of the planes (planes S1 in FIG. 18) having a plane orientation of (001) in the structure equivalent to the cubic structure and the planes (planes S2 in FIG. 18) connected to the foregoing planes and having a plane orientation different from that of each of the foregoing planes. The polytype may be 6H or 15R, for example.

Figure 19:
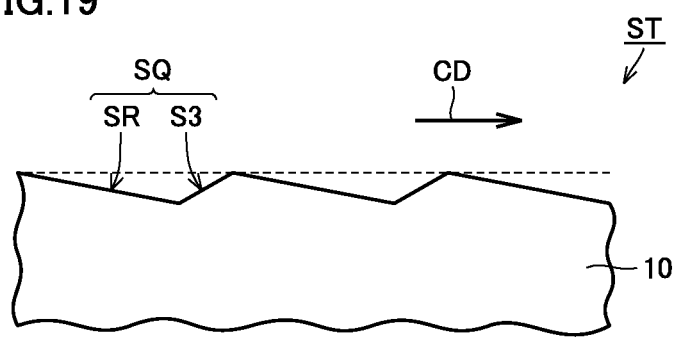
FIG. 19 shows a modification of FIG. 14.

As shown in FIG. 19, side wall surface ST may further include plane S3 (third plane) in addition to combined plane SR. More specifically, side wall surface ST may include a combined plane SQ constituted of periodically repeated plane S3 and combined plane SR. The periodic structure can be observed by a TEM or an AFM, for example. In this case, the off angle of side wall surface ST relative to the {000-1} plane is deviated from the ideal off angle of combined plane SR, i.e., 62°. Preferably, this deviation is small, preferably, in a range of 110°. Examples of a surface included in such an angle range include a surface having a macroscopic plane orientation of the {0-33-8} plane.

More preferably, the off angle of side wall surface ST relative to the (000-1) plane is deviated from the ideal off angle of combined plane SR, i.e., 62°. Preferably, this deviation is small, preferably, in a range of ±10. Examples of a surface included in such an angle range include a surface having a macroscopic plane orientation corresponding to the (0-33-8) plane.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

10: epitaxial substrate (silicon carbide substrate); 11: n layer (impurity layer); 12: JBS region (embedded region); 14: JTE region (side wall impurity region); 15: guard ring region; 16: field stop region; 19: single-crystal substrate; 21: insulating film; 31: Schottky electrode; 42: counter electrode; 71: mask layer; 72, 73: photoresist layer; 101, 102 diode (silicon carbide semiconductor device); BT: bottom surface; CL: element portion; FT: flat surface; P1: upper surface (first main surface); P2: backside surface (second main surface); S1: plane (first plane); S2: plane (second plane); SQ, SR: combined plane; ST: side wall surface; TM: termination portion.

The invention claimed is:

1. A silicon carbide semiconductor device having an element portion provided with a semiconductor element, and a termination portion surrounding said element portion, the silicon carbide semiconductor device comprising:
a silicon carbide substrate made of silicon carbide having a hexagonal single-crystal structure, said silicon carbide substrate having a first main surface and a second main surface opposite to said first main surface, said first main surface having a flat surface that is located in said element portion and a side wall surface that is located in said termination portion, that surrounds said flat surface, and that is inclined relative to said flat surface so as to come close to said second main surface, said silicon carbide substrate including an impurity layer having a first conductivity type, said impurity layer having a portion located at said flat surface of said first main surface;
a Schottky electrode in contact with said impurity layer on said flat surface of said first main surface;
a counter electrode provided on said second main surface; and
an insulating film covering said side wall surface of said first main surface, said side wall surface being inclined by not less than 50° and not more than 80° relative to a {000-1} plane.

2. The silicon carbide semiconductor device according to claim 1,
wherein said side wall surface of said first main surface of said silicon carbide substrate includes a first plane having a plane orientation of {0-33-8}.

3. The silicon carbide semiconductor device according to claim 2,
wherein said side wall surface of said first main surface of said silicon carbide substrate microscopically includes said first plane, and said side wall surface microscopically further includes a second plane having a plane orientation of {0-11-1}.

4. The silicon carbide semiconductor device according to claim 3, wherein said first and second planes of said side wall surface of said first main surface of said silicon carbide substrate form a combined plane having a plane orientation of {0-11-2}.

5. A silicon carbide semiconductor device having an element portion provided with a semiconductor element, and a termination portion surrounding said element portion, the silicon carbide semiconductor device comprising:
a silicon carbide substrate made of silicon carbide having a hexagonal single-crystal structure, said silicon carbide substrate having a first main surface and a second main surface opposite to said first main surface, said first main surface having a flat surface that is located in said element portion and a side wall surface that is located in said termination portion, that surrounds said flat surface, and that is inclined relative to said flat surface so as to come close to said second main surface, said silicon carbide substrate including an impurity layer having a first conductivity type, said impurity layer having a portion located in said flat surface of said first main surface;
a Schottky electrode in contact with said impurity layer on said flat surface of said first main surface;
a counter electrode provided on said second main surface; and
an insulating film covering said side wall surface of said first main surface, said side wall surface having one of plane orientations of {0-33-8}, {0-11-2}, {0-11-4} and {0-11-1} when viewed macroscopically.

6. The silicon carbide semiconductor device according to claim 1, wherein an embedded region is embedded at said flat surface of said first main surface of said silicon carbide substrate, said embedded region being in contact with said Schottky electrode and having a second conductivity type different from said first conductivity type.

7. The silicon carbide semiconductor device according to claim 1, wherein a side wall impurity region is provided at said side wall surface of said first main surface of said silicon carbide substrate, said side wall impurity region having a second conductivity type different from said first conductivity type.

8. The silicon carbide semiconductor device according to claim 7, wherein said side wall impurity region includes a boundary between said side wall surface and said flat surface on said first main surface of said silicon carbide substrate.

9. The silicon carbide semiconductor device according to claim 7, wherein said side wall impurity region is in contact with said Schottky electrode.

10. The silicon carbide semiconductor device according to claim 1, wherein
an embedded region is embedded at said flat surface of said first main surface of said silicon carbide substrate, said embedded region being in contact with said Schottky electrode and having a second conductivity type different from said first conductivity type, and
a side wall impurity region is provided at said side wall surface of said first main surface of said silicon carbide substrate, said side wall impurity region having said second conductivity type, said side wall impurity region having an impurity concentration lower than an impurity concentration of said embedded region, said side wall impurity region being connected to said embedded region.

11. The silicon carbide semiconductor device according to claim 1, wherein said first main surface of said silicon carbide substrate has a bottom surface surrounding said side wall surface in said termination portion, and said bottom surface has a smaller inclination relative to said flat surface than an inclination of said side wall surface relative to said flat surface.

12. The silicon carbide semiconductor device according to claim 11, wherein a guard ring region is provided at said bottom surface of said first main surface of said silicon carbide substrate, said guard ring region having a second conductivity type different from said first conductivity type, said guard ring region being separated from said side wall surface, said guard ring region surrounding said side wall surface.

13. A method for manufacturing a silicon carbide semiconductor device having an element portion provided with a semiconductor element, and a termination portion surrounding said element portion, the method comprising the steps of:
preparing a silicon carbide substrate made of silicon carbide having a hexagonal single-crystal structure, said silicon carbide substrate having a first main surface and a second main surface opposite to said first main surface, said first main surface having a flat surface that is located in said element portion and a side wall surface that is located in said termination portion, that surrounds said flat surface, and that is inclined relative to said flat surface so as to come close to said second main surface, said silicon carbide substrate including an impurity layer having a first conductivity type, said impurity layer having a portion located in said flat surface of said first main surface, the step of preparing said silicon carbide substrate including the step of forming said side wall surface by thermal etching on said first main surface;

forming an insulating film covering said side wall surface of said first main surface;
forming a Schottky electrode in contact with said impurity layer on said flat surface of said first main surface; and
forming a counter electrode on said second main surface.

* * * * *